United States Patent [19]

Sander et al.

[11] 4,327,170

[45] Apr. 27, 1982

[54] PHOTOPOLYMERIZABLE UNSATURATED POLYESTERS AND COPYING MATERIAL PREPARED THEREWITH

[75] Inventors: Jürgen Sander, Kelkheim; Klaus Horn, Hofheim, both of Fed. Rep. of Germany

[73] Assignee: Hoechst Aktiengesellschaft, Fed. Rep. of Germany

[21] Appl. No.: 220,089

[22] Filed: Dec. 24, 1980

[30] Foreign Application Priority Data

Dec. 29, 1979 [DE] Fed. Rep. of Germany ....... 2952698

[51] Int. Cl.$^3$ .............................................. G03C 1/68

[52] U.S. Cl. ................. 430/285; 204/159.19; 430/270; 430/286; 430/300; 430/302; 430/306; 430/905; 528/306

[58] Field of Search ............... 430/285, 905, 300, 302, 430/306, 270, 286; 204/159.19; 528/306

[56] References Cited

U.S. PATENT DOCUMENTS 4,048,035  9/1977  Ide et al. ............................ 430/285

Primary Examiner—Jack P. Brammer
Attorney, Agent, or Firm—James E. Bryan

[57] ABSTRACT

This invention relates to an improvement in a photopolymerizable mixture which contains, as the essential constituents, (a) a polymeric binder, (b) a photoinitiator, and (c) a polyester of an $\alpha,\alpha'$-bis-methylene-dicarboxylic acid and a dihydroxy compound.

5 Claims, No Drawings

PHOTOPOLYMERIZABLE UNSATURATED POLYESTERS AND COPYING MATERIAL PREPARED THEREWITH

This invention relates to a photopolymerizable mixture which contains, as the essential constituents, (a) a compound which is polymerizable by a free-radical mechanism and has terminal ethylenically unsaturated groups, (b) a polymeric binder and (c) a photoinitiator.

Photopolymerizable mixtures of this type have been disclosed, for example, in U.S. Pat. Nos. 2,760,863, 3,060,023 and 3,149,975. The polymerizable, ethylenically unsaturated compounds described in these patents are low-molecular weight and high-molecular weight compounds having terminal or side chain vinyl groups or vinylidene groups, in particular acrylates and methacrylates of low-molecular or high-molecular weight polyhydroxy compounds. In practice, photopolymerizable materials based on esters of this type as the polymerizable compounds have gained acceptance almost exclusively. Among these, the low-molecular weight representatives, in particular, are preferentially employed in industry.

Although these compounds give mixtures having a high light-sensitivity in practice and give exposed products having a high cross-linking density, it would be desirable in some cases to have compounds available, which have different properties, for example a lower volatility and tackiness or a higher resistance to saponifying agents.

German Offenlegungsschrift No. 2,556,845, discloses photopolymerizable mixtures which, as the polymerizable compounds, contain unsaturated polyesters of dicarboxylic acids which have a methylene group in the α-position. These compounds possess many desired mechanical and chemical properties. The light-sensitivity of the mixtures prepared from these, however, does not reach that of the preferred acrylates.

It is the object of the invention to provide photopolymerizable mixtures which, in their light-sensitivity, are comparable to the known mixtures based on acrylates, but do not contain any volatile polymerizable compounds, do not give tacky layers, and the photo-cross-linking products of which have a high resistance to aggressive agents, for example saponifying agents.

The subject of the invention is a photopolymerizable mixture which contains, as the essential constituents:
(a) a polymeric binder,
(b) a photoinitiator, and
(c) a polyester of
    an α,α'-bis-methylene-dicarboxylic acid and a dihydroxy compound.

In particular, the polyesters used are compounds having recurring units of the general formula I

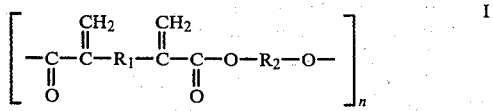

in which $R_1$ is a divalent aliphatic group having 1 to 15 carbon atoms which can also be partially replaced by hetero-atoms, a divalent cycloaliphatic group having 3 to 15 carbon atoms, or a mixed aliphatic-aromatic group having 7 to 15 carbon atoms, $R_2$ is a divalent aliphatic group having 2 to 50 carbon atoms which can also be partially replaced by hetero-atoms, a divalent cycloaliphatic group having 3 to 15 carbon atoms or a mixed aliphatic-aromatic group having 7 to 15 carbon atoms, and n is an integer from 2 to 30, preferably from 2 to 15.

In the compound having units of the formula I, $R_1$ preferably is a divalent group, the terminal members of which are acyclic aliphatic carbon atoms. The terminal carbon atoms are preferably linked via a linear aliphatic chain. This chain can be interrupted by hetero-atoms, such as O, NH and S, in particular O, by cycloaliphatic rings, in particular cyclohexylene rings, by phenylene groups or by olefinic double bonds. Preferably, $R_1$ is an alkylene group having 1 to 5 carbon atoms, and very particular preferably it is a trimethylene group.

$R_2$ is preferably a group of the formula

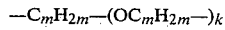

in which m denotes an integer from 2 to 8 and k denotes zero or an integer from 1 to 15.

The unsaturated polyesters used in the mixtures according to the invention are preferably linear, that is to say they are built up exclusively from dicarboxylic acids and dihydroxy compounds. They can, however, also contain a subordinate number of units of tricarboxylic acids and/or triols, as long as this does not adversely affect the solubility of the compounds in organic solvents and in the desired, preferably aqueous, developer solutions. The proportion of branched units should, in general, be below 10 mole percent.

Dicarboxylic acids suitable for the manufacture of the unsaturated linear polyesters are, for example: hexa-1,5-diene-2,5-dicarboxylic acid, hepta-1,6-diene-2,6-dicarboxylic acid, 4-oxa-hepta-1,6-diene-2,6-dicarboxylic acid, 4,4-dimethyl-hepta-1,6-diene-2,6-dicarboxylic acid, 4,4-diethyl-hepta-1,6-diene-2,6-dicarboxylic acid, octa-1,7-diene-2,7-dicarboxylic acid, nona-1,8-diene-2,8-dicarboxylic acid, deca-1,9-diene-2,9-dicarboxylic acid, undeca-1,10-diene-2,10-dicarboxylic acid, dodeca-1,11-diene-2,11-dicarboxylic acid, trideca-1,12-diene-2,12-dicarboxylic acid, tetradeca-1,13-diene-2,13-dicarboxylic acid, hexadeca-1,15-diene-2,15-dicarboxylic acid, 5-oxa-nona-1,8-diene-2,8-dicarboxylic acid, 5-thia-nona-1,8-diene-2,8-dicarboxylic acid, octa-1,4,7-triene-2,7-dicarboxylic acid, 6-oxa-undeca-1,10-diene-2,10-dicarboxylic acid, 5,8-dioxa-dodeca-1,11-diene-2,11-dicarboxylic acid, 5,8,11-trioxa-pentadeca-1,14-diene-2,14-dicarboxylic acid, 1,2-bis-(2-carboxy-prop-2-enyl)-benzene, 1,3-bis-(2-carboxy-prop-2-enyl)-benzene, 1,4-bis-(2-carboxy-prop-2-enyl)-benzene and 1,4-bis-(2-carboxy-prop-2-enyl)-cyclohexane.

The unsaturated polyesters can be prepared in accordance with known processes either by a polycondensation reaction of dicarboxylic acids with dihydroxy compounds or by a transesterification of dicarboxylic acid esters of the formula

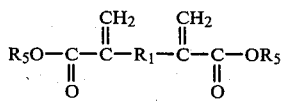

in which $R_5$ denotes a lower alkyl group preferably having 1 to 4 carbon atoms, with dihydroxy compounds. In general, the dimethyl esters or diethyl esters are used in the transesterification reaction. The preparation of the above-mentioned dicarboxylic acids and their dimethyl esters or diethyl esters is described in copending application Ser. No. 220,090, filed Dec. 24, 1980.

In this method, 2 moles of a dialkyl malonate are reacted with 1 mole of a dibromo compound Br-$R_1$-Br. The bis-alkylation products are partially saponified, one carboxyl group of each malonate grouping being liberated in each case, and the dicarboxylic acids are reacted with formaldehyde, with simultaneous decarboxylation, to give the monomeric dicarboxylic acid esters.

Some of these compounds are described in the literature.

The advantage of the synthesis method indicated is that a large number of compounds according to the invention are made readily available by a standard route.

Examples of suitable dihydroxy compounds which can be used are: 2,2-bis-(4-hydroxyethoxy-phenyl)-propane, pentane-1,5-diol, n-hexane-1,6-diol, 2-ethyl-hexane-1,6-diol, 2,3-dimethyl-hexane-1,6-diol, heptane-1,7-diol, cyclohexane-1,4-diol, nonane-1,7-diol, nonane-1,9-diol, 3,6-dimethyl-nonane-1,9-diol, decane-1,10-diol, dodecane-1,12-diol, 1,4-bis-hydroxymethyl-cyclohexane, 2-ethyl-1,4-bis-hydroxymethyl-cyclohexane, 2-methyl-cyclohexane-1,4-diethanol, 2-methyl-cyclohexane-1,4-dipropanol, thio-dipropylene glycol, 3-methyl-pentane-1,5-diol, dibutylene glycol, neopentyl glycol hydroxypivalate, 4,8-bis-hydroxymethyl-tricyclodecane, n-but-2-ene-1,4-diol, n-but-2-yne-1,4-diol, n-hex-3-yne-2,5-diol, 1,4-bis-(2-hydroxyethoxy)-but-2-yne, p-xylylene glycol, 2,5-dimethyl-hex-3-yne-2,5-diol, bis-(2-hydroxyethyl)-sulfide, 2,2,4,4-tetramethyl-cyclobutane-1,3-diol, di-, tri-, tetra-, penta- and hexa-ethylene glycol, di- and tri-propylene glycol and polyethylene glycols having a mean molecular weight of 200, 300, 400, and 600.

Differing unsaturated polyesters can be prepared by varying the two radicals $R_1$ and $R_2$. The use of differing polyesters or of mixtures thereof makes it possible to vary widely the material properties of the recording materials, manufactured from these polyesters.

It has been found that copying layers containing compounds of the formula I, in which the radical $R_1$ consists of a chain containing 3 atoms, for example of the 1,3-propylene, 2-oxa-1,3-propylene or 2,2-dimethyl-1,3-propylene radical, have the highest light-sensitivity, because it is possible that cyclopolymerization reactions can proceed additionally. This applies in particular to compounds I which contain the trimethylene radical as $R_1$.

The varying demands which are made in practice on copying layers, then can be met by the selection of suitable linear polyesters.

In this way, for example, the compatibility of the compounds according to the invention with binders, the flexibility, the mechanical strength, the solvent resistance or the ability of the layer to be developed can be adapted to the varying requirements.

Advantageously, conventional low-molecular weight polymerizable compounds which contain two or more polymerizable groups, in particular acrylate or methacrylate groups, also can be added to the compounds according to the invention; in this case, care must of course be taken to ensure that the advantages which are obtained by the use of the new linear polymeric compounds in the photopolymerizable composition, as discussed above, are not unduly reduced by these conventional compounds. For example, a plasticizer effect can be obtained by this addition. In general, not more than 70% by weight of the total quantity of monomers, preferably not more than 60%, should consist of low-molecular weight acrylates.

Among the low-molecular weight polymerizable compounds, acrylates or methacrylates of polyhydric aliphatic alcohols are especially preferred, and very particularly compounds of the formula

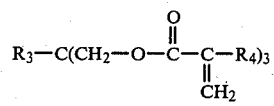

wherein $R_3$ denotes H, an alkyl group having 1 to 6 carbon atoms, preferably a methyl or ethyl group, a nitro group or a methylol group, and $R_4$ denotes H or a methyl group.

Examples of suitable compounds of the formula are triacrylates and trimethacrylates of trimethylolmethane, trimethylolethane, trimethylolpropane, trimethylolnitromethane and pentaerythritol.

The total amount of polymerizable compounds in the photopolymerizable mixture is in general between about 10 and 90, preferably between 20 and 60, percent by weight.

Depending on the planned application and depending on the desired properties, the new photopolymerizable mixtures can contain diverse substances are additives. Examples are: inhibitors to prevent thermal polymerization of the compositions, hydrogen donors, substances which modify the sensitometric properties of such layers, dyestuffs, colored and uncolored pigments, color precursors, indicators, plasticizers and the like.

These constituents advantageously should be selected in such a way that they have the lowest possible absorption in the range of actinic radiation, important for the initiation process.

Within the scope of this description, actinic radiation is to be understood as any radiation, the energy of which corresponds at least to that of shortwave visible light. Longwave UV radiation, and also electron radiation, X-rays and laser radiation are particularly suitable.

A large number of substances can be used as photoinitiators in the mixture according to the invention. Examples are benzoin, benzoin ethers, polynuclear quinones, for example 2-ethyl-anthraquinone, acridine derivatives, for example 9-phenyl-acridine, 9-p-methoxyphenyl-acridine, 9-acetylamino-acridine and benzo(a)acridine; phenazine derivatives, for example 9,10-dimethyl-benzo(a)phenazine, 9-methyl-benzo(a)phenazine and 10-methoxy-benzo(a)phenazine; quinoxaline derivatives, for example 6,4′,4″-trimethoxy-2,3-diphenyl-quinoxaline and 4′,4″-dimethoxy-2,3-diphenyl-5-azaquinoxaline; quinazoline derivatives and certain trichloromethyl-s-triazines. The amount of photoinitiator is in general between 0.1 and 10% by weight, relative to the non-volatile constituents of the mixture.

If the imaging is carried out with electron radiation, those photoinitiators, the absorption ranges of which are in the shorter-wavelength part of the electromagnetic spectrum and which thus have a low sensitivity to daylight, are also suitable, in addition to the known photolytic acid donors which are sensitive to visible light and near UV light. This has the advantage that the recording materials can be handled without excluding light and that the storage-stability of the materials can be increased.

Examples of starters of this type are tribromomethylphenyl-sulfone, 2,2',4,4',6,6'-hexabromo-diphenylamine, pentabromoethane, 2,3,4,5-tetrachloro-aniline, pentaerythritol tetrabromide, chloroterphenyl resins or chlorinated paraffins.

The hydrogen donors used are in the main aliphatic polyethers. If appropriate, this function also can be fulfilled by the binder or by the polymerizable monomer, if these have labile hydrogen atoms.

A large number of soluble organic, preferably saturated polymers can be employed as the binders. Examples are: polyamides, polyvinyl esters, polyvinyl acetals, polyvinyl ethers, polyacrylates, polymethacrylates, polyesters, alkyd resins, polyacrylamide, polyvinyl alcohol, polyethylene oxide, polydimethylacrylamide, polyvinylpyrrolidone, polyvinylmethylformamide, polyvinylmethylacetamide and copolymers of the monomers which form the homopolymers enumerated.

Other possible binders are natural substances or modified natural substances, for example gelatin, cellulose ethers, and the like.

With particular advantage, those binders are used which are insoluble in water but soluble or at least swellable in aqueous-alkaline solutions, because layers containing such binders can be developed with the preferred aqueous-alkaline developers. Binders of this type can, for example, contain the following groups: —COOH, —PO$_3$H$_2$, —SO$_3$H, —SO$_2$NH$_2$, —SO$_2$—NH—CO— and the like. Examples of these are: Maleate resins, polymers of β-methacryloyloxy-ethyl N-(p-tolyl-sulfonyl)-carbamate and copolymers of these and similar monomers with other monomers and styrene/maleic anhydride copolymers. Methyl methacrylate/methacrylic acid copolymers, and copolymers of methacrylic acid, alkyl methacrylates and methyl methacrylate and/or styrene, acrylonitrile and the like, such as are described in German Auslegeschriften Nos. 2,064,080 and 2,363,806, are preferred.

The amount of binder is in general 10 to 90, preferably 40 to 80, percent by weight of the non-volatile constituents of the mixture.

The photopolymerizable mixture can be employed for the most diverse applications, for example for the manufacture of safety glass, of lacquers which are cured by light or corpuscular radiation, for example electron beams, in the field of dentistry and in particular as a light-sensitive copying material in the field of reproduction.

The detailed description of the invention is restricted to this field of application, but does not limit the invention thereto. Possible applications in this field which may be mentioned are: copying layers for the photomechanical production of printing forms for letterpress printing, planographic printing, gravure printing and screen printing, of relief copies, for example the production of texts in Braille, of individual copies, tanned images, pigment images and the like. Moreover, the mixtures can be used for the photomechanical preparation of etch resists, for example for the production of nameplates, of printed circuits and for chemical milling. The mixtures according to the invention are of particular importance as copying layers for the photomechanical production of planographic printing forms and of etch resists, in particular as presensitized materials.

The commercial use of the mixture for the applications mentioned can take place in the form of a fluid solution or dispersion, for example as a so-called photoresist composition, which is applied by the user himself to an individual support, for example for chemical milling, for the production of printed circuits, of screen printing stencils and the like. The mixture also can be present as a solid light-sensitive layer on a suitable support in the form of a light-sensitive copying material, which has been precoated in such a way that it is stable in storage, for example for the production of printing forms. It is likewise suitable for the production of dry resists.

In general, it is advantageous largely to protect the mixtures from the influence of atmospheric oxygen during the light polymerization. In the case of using the mixture in the form of thin copying layers, it is advisable to apply a suitable cover film which has a low permeability to oxygen. This film can be self-supporting and can be peeled off before developing the copying layer. For example, polyester films are suitable for this purpose. The cover film also can consist of a material which dissolves in the developer fluid or at least can be removed during development from the uncured areas. Examples of materials suitable for this purpose are waxes, polyvinyl alcohol, polyphosphates, sugars and the like.

Examples of suitable supports for copying materials produced with the mixture according to the invention, are aluminum, steel, zinc, copper and plastic films, for example films of polyethylene terephthalate or cellulose acetate, and screen-printing supports, such as gauze of polyamide-6. In many cases, it is advantageous to subject the surface of the support to a (chemical or mechanical) pretreatment, which has the object of correctly adjusting the adhesion of the layer or of reducing the reflectance of the support in the actinic range of the copying layer (antihalation).

The manufacture of the light-sensitive materials, using the mixture according to the invention, is carried out in known manner.

Thus, this mixture can be taken up in a solvent and the solution or dispersion can be applied as a film to the envisaged support by slot-die coating, spraying, dipping, roller application and the like, and the film then can be dried thereon. Thick layers (for example layers of 250 μm and higher) are advantageously prepared by extrusion as a self-supporting film which, if appropriate, is then laminated to the support. In the case of dry resists, solutions of the mixture are applied to transparent supports and dried thereon. The light-sensitive layers, thus obtained—of a thickness between about 10 and 100 μm—are then laminated, together with the temporary support, to the desired substrate.

The processing of the copying materials is carried out in known manner. For developing, they are treated with a suitable developer solution, preferably a weakly alkaline aqueous solution, the unexposed constituents of the layer being removed and the exposed areas of the resist layer remaining on the support.

In the following test, examples of the copying composition according to the invention are given. Initially, the preparation of a number of new polyesters is described here. The general instruction A describes the transesterification of dicarboxylic acid esters with dihydroxy compounds, and the general instruction B describes the polycondensation reaction of dicarboxylic acids with dihydroxy compounds. In copying compositions according to the invention, the polyesters resulting in each case were numbered consecutively as polymerizable compounds 1 to 22, and they recur under this designation in the Examples.

In the Examples, parts by weight (p.b.w.) and parts by volume (p.b.v.) have the relationship of the g to the ml. Unless otherwise stated, percentage ratios and quantity ratios are to be understood as weight units.

General Instruction A for the preparation of Compounds 1 to 12

The unsaturated dicarboxylic acid ester

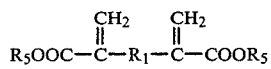

and the diol are reacted in a molar ratio of 1:1 for 5 hours at 175° C. and 934 molar in a bulb tube in the presence of 1 percent by weight of zinc acetate, 1 percent by weight of hydroquinone and 1 percent by weight of copper-I chloride. The alcohol formed is distilled off. The residue is then dried for 1 hour at 100° C. under 27 mbar and for 1 hour at 100° under 0.13 mbar. The polyester remains as a viscous residue in virtually quantitative yield.

The polyesters 1 to 12 thus prepared do not show any OH band in the IR spectrum. The signals characterizing the vinyl protons in the NMR spectrum are indicated in Table 1.

TABLE 1

| | Polyesters containing units of the general formula I | | | |
|---|---|---|---|---|
| | | | NMR signals of the vinyl protons | |
| Compound No. | $R_1$ | $R_2$ | δ(ppm) | (CDCl$_3$) |
| 1 | —(CH$_2$)$_2$— | —(CH$_2$)$_2$—O—(CH$_2$)$_2$— | 6.16 | 5.50 |
| 2 | —(CH$_2$)$_3$— | —(CH$_2$)$_2$—O—(CH$_2$)$_2$— | 6.22 | 5.59 |
| 3 | —(CH$_2$)$_4$— | —(CH$_2$)$_2$—O—(CH$_2$)$_2$— | 6.14 | 5.52 |
| 4 | —(CH$_2$)$_5$— | —(CH$_2$)$_2$—O—(CH$_2$)$_2$— | 6.13 | 5.50 |
| 5 | —(CH$_2$)$_6$— | —(CH$_2$)$_2$—O—(CH$_2$)$_2$— | 6.10 | 5.47 |
| 6 | —(CH$_2$)$_{10}$— | —(CH$_2$)$_2$—O—(CH$_2$)$_2$— | 6.12 | 5.50 |
| 7 | —(CH$_2$)$_2$—O—(CH$_2$)$_2$— | —(CH$_2$)$_2$—O—(CH$_2$)$_2$— | 6.22 | 5.62 |
| 8 | —(CH$_2$CH$_2$O)$_2$(CH$_2$)$_2$— | —(CH$_2$)$_2$—O—(CH$_2$)$_2$— | 6.23 | 5.65 |
| 9 | —(CH$_2$CH$_2$)$_3$(CH$_2$)$_2$— | —(CH$_2$)$_2$—O—(CH$_2$)$_2$— | 6.24 | 5.66 |
| 10 | —H$_2$C-1,4-phenylene-CH$_2$— | —(CH$_2$)$_2$—O—(CH$_2$)$_2$— | 6.20 | 5.42 |
| 11 | —H$_2$C-1,3-phenylene-CH$_2$— | —(CH$_2$)$_2$—O—(CH$_2$)$_2$— | 6.22 | 5.43 |
| 12 | —H$_2$C-1,2-phenylene-CH$_2$— | —(CH$_2$)$_2$—O—(CH$_2$)$_2$— | 6.22 | 5.23 |

General Instruction B for the preparation of Compounds 13 to 22

The unsaturated dicarboxylic acid and the diol in a molar ratio of 1:1.2 are heated in toluene under reflux, through a water separator, in the presence of 1 percent by weight of an acid catalyst, for example concentrated sulfuric acid, and 1 percent by weight of a polymerization inhibitor, for example hydroquinone, until the theoretical amount of water has been formed. The organic phase is washed, dried, filtered and freed from solvent. The polyester remains as a viscous residue after drying, for one hour in each case, at 100° C. under 27 mbar and 100° C. under 0.13 mbar. The polyesters 13 and 21 thus prepared do not show any OH band in the IR spectrum. The signals characterizing the vinyl protons in the NMR spectrum correspond to the values already given. The yields are indicated in Table 2.

TABLE 2

| | Polyesters containing units of the general formula I | | |
|---|---|---|---|
| Compound No. | $R_1$ | $R_2$ | Yield (%) |
| 13 | —(CH$_2$)$_3$— | —CH$_2$-1,4-cyclohexylene-CH$_2$— | 70 |
| 14 | —(CH$_2$)$_3$— | —(CH$_2$)$_2$— | 53 |
| 15 | —(CH$_2$)$_3$— | —(CH$_2$CH$_2$O)$_2$—(CH$_2$)$_2$— | 59 |
| 16 | —(CH$_2$)$_3$— | —(CH$_2$)$_5$— | 72 |
| 17 | —(CH$_2$)$_3$— | —(CH$_2$)$_3$— | 67 |
| 18 | —(CH$_2$)$_3$— | —(CH$_2$)$_4$— | 53 |
| 19 | —(CH$_2$)$_3$— | —(CH$_2$)$_6$— | 93 |
| 20 | —(CH$_2$)$_3$— | —(CH$_2$CH$_2$O)$_3$—(CH$_2$)$_2$— | 68 |
| 21 | —(CH$_2$)$_3$— | —(CH$_2$)$_{10}$— | 95 |
| 22 | —(CH$_2$)$_3$— | CH$_3$<br>\|<br>C—(1,4-phenylene-O—(CH$_2$)$_2$—)$_2$<br>\|<br>CH$_3$ | 90 |

EXAMPLE 1

Electrochemically roughened and anodized aluminum, having an oxide layer of 3 g/m$^2$, which had been pretreated with an aqueous solution of polyvinylphosphonic acid, was used as the support for printing plates. The support was coated with a solution of the following composition.

| | |
|---|---|
| 11.7 parts by weight | of a 33.4% solution of a methyl methacrylate/methacrylic acid copolymer, having an acid number of 110 and a mean molecular weight of 35,000, in methyl ethyl ketone, |
| 2.0 parts by weight | of unsaturated polyester (compounds 1–22), |
| 2.0 parts by weight | of trimethylolethane triacrylate, |
| 0.07 part by weight | of 9-phenyl-acridine, |
| 0.07 part by weight | of 4-dimethylamino-4'-methyl-dibenzalacetone, |
| 0.04 part by weight | of an azo dyestuff obtained from 2,4-dinitro-6-chloro-benzenediazonium salt and 2-methoxy-5-acetyl-amino-N-cyanoethyl-N-hydroxyethyl-aniline, |
| 38.0 parts by weight | of ethylene glycol monoethyl ether and |
| 13.5 parts by weight | of butyl acetate. |

The application was effected by whirler-coating in such a way that a dry weight of 2.8–3 g/m$^2$ was obtained. Then, the plate was dried for 2 minutes at 100° C. in a circulating air oven.

The light-sensitive coated plate was coated with a 15% aqueous solution of polyvinyl alcohol (12% of residual acetyl groups, K value 4). After drying, a cover layer having a weight of 4–5 g/m² was obtained.

The printing plate obtained was exposed for 30 seconds using a 5 kW metal halide lamp at a distance of 110 cm under a 13-step exposure wedge with density increments of 0.15.

The plate was then developed with a developer of the following composition:

| | |
|---|---|
| 120 parts by weight | of sodium metasilicate . 9 H₂O, |
| 2.13 parts by weight | of strontium chloride, |
| 1.2 parts by weight | of a non-ionic wetting agent (coconut fatty alcohol polyoxyethylene ether with about 8 oxyethylene units), |
| 0.12 part by weight | of an antifoaming agent, and |
| 4,000 parts by weight | of fully deionized water. |

The plate was rendered acidic with 1 percent phosphoric acid and was inked with greasy printing ink. The following fully cross-linked wedge steps were obtained:

| Compound No. | Wedge Steps |
|---|---|
| 1 | 3 |
| 2 | 5 |
| 3 | 2 |
| 4 | 3 |
| 5 | 4 |
| 6 | 1 |
| 7 | 1 |
| 8 | 1 |
| 9 | 2 |
| 10 | ½ |
| 11 | ½ |
| 12 | 2 |
| 13 | 2 |
| 14 | 3 |
| 15 | 2 |
| 16 | 3 |
| 17 | 3 |
| 18 | 2 |
| 19 | 1 |
| 20 | 2 |
| 21 | 4 |
| 22 | 4 |

EXAMPLE 2

A solution of the following composition was whirler-coated onto the support indicated in Example 1 in such a way that a layer weight of 3 g/m² was obtained:

| | |
|---|---|
| 11.7 parts by weight | of the copolymer solution indicated in Example 1, |
| 38.0 parts by weight | of ethylene glycol monoethyl ether, |
| 13.5 parts by weight | of butyl acetate, |
| 3.9 parts by weight | of polyester, |
| 0.07 part by weight | of 9-phenyl-acridine, |
| 0.04 part by weight | of the azo dyestuff indicated in Example 1, and |
| 0.07 part by weight | of 4-dimethylamino-4'-methyl-dibenzalacetone. |

The plate was processed further in the same way as in Example 1.

The following number of fully cross-linked wedge steps was obtained:

| Compound No. | Exposure Time (seconds) | Wedge Steps |
|---|---|---|
| 2 | 15 | 2 |
|  | 30 | 5 |
| 5 | 15 | 1 |
|  | 30 | 3 |
| 4 | 15 | 1 |
|  | 30 | 3 |
| 21 | 15 | 2 |
|  | 30 | 4 |
| 14 | 15 | 1 |
|  | 30 | 2 |
| 16 | 15 | 1 |
|  | 30 | 3 |
| 17 | 15 | 1 |
|  | 30 | 3 |

Comparable results were obtained when 2,2-dimethoxy-2-phenyl-acetophenone or 2-(4-ethoxy-naphth-1-yl)-4,6-bis-trichloromethyl-s-triazine or 2-(acenaphth-5-yl)-4,6-bis-trichloromethyl-s-triazine was used in place of 9-phenylacridine.

Using compounds 2 and 21, printing trials were carried out, which were stopped after 150,000 prints, even though breaks in the dots of the 150 dot half-tone screen were not yet detectable. If the unsaturated polyesters having one double bond, based on itaconic acid, α-methyleneglutaric acid and α-methylene-δ-methyl adipic acid and diethylene glycol in each case, were used in place of the unsaturated polyesters with two double bonds, the cross-linking density was not sufficient for one step of a step wedge.

EXAMPLE 3

A solution of the following composition was whirler-coated onto the support indicated in Example 1 in such a way that a layer weight of 3.5 g/m² was obtained:

| | |
|---|---|
| 10.0 parts by weight | of a 21.7% solution of a terpolymer of styrene, n-hexyl methacrylate and methacrylic acid (10:60:30), having an acid number of 190, in butanone, |
| 2.0 parts by weight | of compound 2, |
| 0.05 part by weight | of 9-phenyl-acridine, and |
| 0.03 part by weight | of methyl violet (C.I. 42,535) in |
| 18.0 parts by weight | of butanone, and |
| 7.5 parts by weight | of butyl acetate. |

The coated plate was then dried for 2 minutes at 100° C. in a circulating air oven and provided with a cover layer as in Example 1. The plate was exposed for 4, 8, 15, and 30, seconds under a 13-step exposure wedge as described in Example 1 and was developed with a developer of the following composition:

| | |
|---|---|
| 5.3 parts by weight | of sodium metasilicate . 9 H₂O, |
| 3.4 parts by weight | of tert. sodium phosphate . 12 H₂O, |
| 0.3 part by weight | of sec. sodium phosphate . 12 H₂O, and |
| 91.0 parts by weight | of fully deionized water. |

The plate was rendered acidic with 1 percent phosphoric acid and linked with greasy printing ink. Counting out of the fully cross-linked gloss steps gave the following pattern:

| Exposure time: | Seconds | | | |
|---|---|---|---|---|
| 5 kW metal halide lamp | 4 | 8 | 15 | 30 |
| corresponding fully cross-linked gloss steps | 1 | 3 | 5 | 7 |

EXAMPLE 4

A solution as described in Example 3 was whirler-coated onto a cleaned support, which consisted of an insulating material with a 35 μm copper deposit, in such a way that a layer thickness of about 5 μm was obtained. The layer was dried for a further 5 minutes at 100° C. in a circulating air oven. Then, a cover layer as in Example 1 was applied. The coating and drying process also can be carried out on both sides.

Then, the plate was exposed for 2, 4, 8, 16, 32, and 64 seconds using a 5 kW metal halide lamp at a distance of 140 cm under a step wedge, as described in Example 1, and the plate was developed in a spray processor with a 0.8% sodium carbonate solution for a period of between 30 and 60 seconds.

The following fully cross-linked wedge steps were obtained:

| Exposure time (seconds) | Wedge steps |
|---|---|
| 2 | 0 |
| 4 | 2 |
| 8 | 5 |
| 16 | 7 |
| 32 | 9 |
| 64 | 10 |

When the cross-linkable layer was exposed under a circuit original and developed, the cross-linked areas were resistant to the iron-III chloride solution customary in printed circuit board technology. The etch resistance was good.

It will be obvious to those skilled in the art that many modifications may be made within the scope of the present invention without departing from the spirit thereof, and the invention includes all such modifications.

What is claimed is:

1. A photopolymerizable mixture which contains, as the essential constituents,
   (a) a polymeric binder,
   (b) a photoinitiator, and
   (c) a polyester of an $\alpha,\alpha'$-bis-methylene-dicarboxylic acid and a dihydroxy compound.

2. A photopolymerizable mixture as claimed in claim 1 which comprises, as the polyester, a compound having recurring units of the general formula

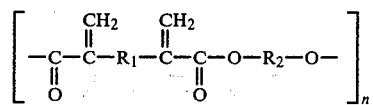

in which $R_1$ is a divalent aliphatic group having 1 to 15 carbon atoms which also can be partially replaced by hetero-atoms, a divalent cycloaliphatic group having 3 to 15 carbon atoms, or a mixed aliphatic-aromatic group having 7 to 15 carbon atoms, $R_2$ is a divalent aliphatic group having 2 to 50 carbon atoms which also can be partially replaced by hetero-atoms, a divalent cycloaliphatic group having 3 to 15 carbon atoms or a mixed aliphatic-aromatic group having 7 to 15 carbon atoms, and n is an integer from 2 to 30.

3. A photopolymerizable mixture as claimed in claim 2 which comprises a compound having recurrent units of the general formula I, in which $R_1$ is an alkylene group having 1 to 5 carbon atoms.

4. A photopolymerizable mixture as claimed in claim 2 which comprises a compound having recurring units of the general formula I, in which $R_2$ is a group of the formula $$-C_mH_{2m}-(OC_mH_{2m}-)_k$$

in which m is an integer from 2 to 8 and k is zero or an integer from 1 to 15.

5. A photopolymerizable copying material comprising a support and a photopolymerizable layer and containing, as the essential layer constituents,
   (a) a polymeric binder,
   (b) a photoinitiator, and
   (c) a polyester of an $\alpha,\alpha'$-bis-methylene-dicarboxylic acid and a dihydroxy compound.

* * * * *